(12) United States Patent
Iwabuchi et al.

(10) Patent No.: US 7,417,104 B2
(45) Date of Patent: Aug. 26, 2008

(54) POROUS FILM-FORMING COMPOSITION, PATTERNING PROCESS, AND POROUS SACRIFICIAL FILM

(75) Inventors: Motoaki Iwabuchi, Joetsu (JP); Yoshitaka Hamada, Joetsu (JP); Tsutomu Ogihara, Joetsu (JP); Takeshi Asano, Joetsu (JP); Takafumi Ueda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 206 days.

(21) Appl. No.: 11/148,371

(22) Filed: Jun. 9, 2005

(65) Prior Publication Data
US 2005/0277756 A1    Dec. 15, 2005

(30) Foreign Application Priority Data
Jun. 10, 2004    (JP) ............................ 2004-172236

(51) Int. Cl.
C08G 77/08    (2006.01)
C08L 83/04    (2006.01)

(52) U.S. Cl. ............................ 528/21; 528/27; 528/29; 528/43

(58) Field of Classification Search .................. 528/21, 528/27, 29
See application file for complete search history.

(56) References Cited

U.S. PATENT DOCUMENTS

| | | | |
|---|---|---|---|
| 5,100,503 A | 3/1992 | Allman et al. | |
| 5,324,550 A | 6/1994 | Yamaguchi et al. | |
| 5,457,003 A * | 10/1995 | Tanaka et al. | 430/176 |
| 6,025,117 A | 2/2000 | Nakano et al. | |
| 6,268,457 B1 | 7/2001 | Kennedy et al. | |
| 6,420,088 B1 | 7/2002 | Angelopoulos et al. | |
| 6,495,264 B2 | 12/2002 | Hayashi et al. | |
| 6,506,497 B1 | 1/2003 | Kennedy et al. | |
| 6,515,073 B2 | 2/2003 | Sakamoto et al. | |
| 6,576,393 B1 | 6/2003 | Sugita et al. | |
| 2002/0020327 A1 | 2/2002 | Hayashi et al. | |
| 2002/0195419 A1 | 12/2002 | Pavelchek | |
| 2003/0091838 A1 | 5/2003 | Hayashi et al. | |
| 2003/0104225 A1 | 6/2003 | Shiota et al. | |
| 2003/0198877 A1 * | 10/2003 | Pfeiffer et al. | 430/15 |
| 2003/0209515 A1 | 11/2003 | Pavelchek | |
| 2004/0191479 A1 * | 9/2004 | Hatakeyama et al. | 428/141 |
| 2004/0247900 A1 | 12/2004 | Ogihara et al. | |
| 2004/0253461 A1 * | 12/2004 | Ogihara et al. | 428/447 |

FOREIGN PATENT DOCUMENTS

| | | |
|---|---|---|
| JP | 63-138353 A | 6/1988 |
| JP | 5-27444 A | 2/1993 |
| JP | 6-138664 A | 5/1994 |
| JP | 7-69611 A | 3/1995 |
| JP | 10-69072 A | 3/1998 |
| JP | 11-60735 A | 3/1999 |
| JP | 3118887 B2 | 10/2000 |
| JP | 2000-356854 A | 12/2000 |
| JP | 2001-53068 A | 2/2001 |
| JP | 2001-92122 A | 4/2001 |
| JP | 2001-343752 A | 12/2001 |
| JP | 2001-354904 A | 12/2001 |
| JP | 2003-502449 A | 1/2003 |
| JP | 2003-157807 A | 5/2003 |
| JP | 2005-18054 A | 1/2005 |
| WO | WO-00/77575 A1 | 12/2000 |

OTHER PUBLICATIONS

Lynch et al., Proc SPIE vol. 2195, 1994, pp. 225-229.
Lin et al., Proc. SPIE vol. 3678, 1999, pp. 241-250.

* cited by examiner

Primary Examiner—Marc S Zimmer
(74) Attorney, Agent, or Firm—Birch, Stewart, Kolasch & Birch, LLP

(57) ABSTRACT

A porous film-forming composition is provided comprising (A) a polymer obtained by hydrolytic condensation of a hydrolyzable silane having formula (1):

$$R^1{}_n\text{—Si—}R^2{}_{4-n} \quad (1)$$

wherein $R^1$ is a monovalent organic group or hydrogen, $R^2$ is a hydrolyzable group or a hydroxyl group and n is an integer of 0 to 3, a hydrolyzate thereof or a partial condensate thereof, with the proviso that at least one silicon compound having an organic crosslinkable group as $R^1$ is included, the polymer being capable of crosslinking reaction by the organic crosslinkable group, and (B) an organic solvent. The composition has improved storage stability, filling properties, adhesion and coating uniformity sufficient to form a sacrificial film which is dissolvable in a stripping solution.

2 Claims, 4 Drawing Sheets

POROUS FILM-FORMING COMPOSITION, PATTERNING PROCESS, AND POROUS SACRIFICIAL FILM

CROSS-REFERENCE TO RELATED APPLICATION

This Nonprovisional application claims priority under 35 U.S.C. §119(a) on Patent Application No. 2004-172236 filed in Japan on Jun. 10, 2004, the entire contents of which are hereby incorporated by reference.

TECHNICAL FIELD

This invention relates to a porous film-forming composition having improved storage stability, filling properties and coating uniformity sufficient to form a sacrificial film, a patterning process, and a porous sacrificial film formed from the composition.

BACKGROUND ART

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 μm or less), a shorter wavelength light source is required, and in particular, photolithography using ArF excimer laser light (193 nm) is now under investigation.

At the initial stage of KrF lithography, steppers having achromatic lenses or catoptric systems combined with broadband light were developed. However, since the precision of achromatic lenses or aspherical catoptric systems was insufficient, a combination of narrow band laser light with diotric single lenses became the main stream. In general, it is a well-known phenomenon for single wavelength exposure that incident light interferes with reflected light from the substrate to generate standing waves. A so-called halation phenomenon that light is collected or scattered by irregularities on the substrate is also known. Both the standing waves and the halation induce dimensional changes of pattern linewidth or the like, shape collapse or the like. The use of coherent monochromatic light, combined with a reduction of wavelength, further amplifies the standing waves and halation. Then as a method of suppressing halation or standing waves, a method of adding a light absorber to resist and a method of laying an antireflective film on the resist upper surface or on the substrate surface were proposed. However, the method of adding a light absorber gives rise to the problem that the resist pattern shape is tapered. With the recent progress toward shorter wavelengths and smaller feature sizes, the influence of standing waves and halation on pattern dimensional changes becomes more serious beyond the level that can be managed by the addition of a light absorber.

In principle, an overlying transmission type antireflection coating (ARC) is effective only for reducing standing waves, but not for halation. Since the refractive index of an overlying ARC to completely offset standing waves is ideally the square root of a refractive index of resist, an ideal value of 1.34 is given to ARC for combination with the polyhydroxystyrene-base resist for use in KrF lithography having a refractive index of 1.8. An ideal value of 1.27 is given to ARC for combination with the alicyclic acrylic resist for use in ArF lithography having a refractive index of 1.6. Materials having such a low refractive index are limited to perfluoro materials. However, the overlying ARC must be made of water-soluble materials because it is advantageous from the process aspect that the overlying ARC is strippable during alkaline development. If hydrophilic substituent groups are introduced into a highly hydrophobic perfluoro material to tailor it to be water soluble, the refractive index of the material is increased so that the ideal value is increased to about 1.42 for KrF and to about 1.5 for ArF. Then, if patterning to a size of 0.20 μm or less is done by KrF lithography, a mere combination of a light absorber with an overlying ARC fails to suppress the influence of standing waves. In the ArF lithography, the effect of an overlying ARC is almost unexpectable for the above-described reason. In the KrF lithography as well, it will become necessary to lay an antireflection film below the resist as a future reduction of linewidth imposes more severe management of linewidth.

In the case of an antireflective film underlying the resist, when a high reflection substrate such as polysilicon or aluminum underlies, a material having an optimum refractive index (n value) and absorption coefficient (k value) is designed to an appropriate film thickness, whereby the reflectance from the substrate can be reduced to below 1%, achieving a significant antireflection effect. In an example wherein the wavelength is 193 nm and a resist has a refractive index of 1.7, if the underlying ARC has a refractive index (real part of complex refractive index) n of 1.5, an extinction coefficient (imaginary part of complex refractive index) k of 0.5, and a thickness of 42 nm, then the reflectance becomes below 0.5%. However, if the substrate has steps, the ARC largely varies its thickness at the steps. The antireflection effect of the underlying film utilizes not only light absorption, but also the interference effect. The first base of 40 to 45 nm having the enhanced interference effect has an accordingly enhanced antireflection effect, but the reflectance largely varies with a change of film thickness. JP-A 10-69072 discloses a high conformity antireflective film-forming material in which the molecular weight of a base resin is increased to minimize the variation of film thickness at steps. As the molecular weight of a base resin increases, there arise problems that more pinholes generate after spin coating, filtration becomes difficult, a viscosity change with the passage of time leads to a variation of film thickness, and crystals precipitate at the nozzle tip. The conformal behavior is developed only at relatively low steps.

Another probable method uses a film thickness of at least the third base (i.e., of at least 170 nm) where the variation of reflectance due to a film thickness variation is relatively small. As long as the k value is in a range of 0.2 to 0.3 and the film thickness is at least 170 nm, the variation of reflectance due to a film thickness variation is small and the reflectance is kept below 1.5%.

In the event the underlay below the antireflective film is a transparent film like an oxide or nitride film and steps exist below that transparent film, the thickness of the transparent film varies even if the surface of the transparent film is planarized as by chemical mechanical polishing (CMP). In this event, it is possible to make the thickness of the overlying antireflective film uniform. If the thickness of a transparent film underlying the antireflective film varies, the thickness of the minimum reflective film is shifted by the thickness of the transparent film at a period of λ/2n (wherein λ is an exposure wavelength and n is a refractive index of the transparent film at that wavelength). Even if the thickness of the antireflective film is set equal to the thickness (5 nm) of the minimum reflective film when the underlay is a reflective film, there develop some areas having an increased reflectance due to thickness variations of the transparent film. In this regard, the thickness of the antireflective film must be at least 170 nm, as in the above-mentioned event, for stabilizing the reflectance relative to thickness variations of the underlying transparent film as well.

The materials of which the antireflective film is made are generally divided into inorganic and organic materials. A typical inorganic material is a SiON film. This has the advantages that it can be formed by CVD of a gas mixture of silane and ammonia, and the etching load on resist is light due to a high selective ratio of etching relative to resist, but the range of application is restricted because of difficulty of peeling. Because of a nitrogen atom-containing basic substrate, another drawback arises that it is susceptible to footing in the case of positive resist and an undercut profile in the case of negative resist.

The organic material has the advantages that spin coating is possible without a need for a special equipment as needed for CVD and sputtering, peeling is possible like resist, no footing occurs, the shape is obedient, and adhesion to resist is good. Thus a number of antireflective films based on organic materials have been proposed. For example, JP-B 7-69611 describes a composition comprising a condensate of a diphenylamine derivative with a formaldehyde-modified melamine resin, an alkali-soluble resin, and a light-absorbing agent. However, since most light-absorbing agents have aromatic groups or double bonds, the addition of a light-absorbing agent undesirably increases dry etching resistance and rather reduces a selective ratio of dry etching relative to the resist. As the feature size becomes finer, the drive toward resist film slimming is accelerated. In the ArF exposure lithography of the next generation, acrylic or alicyclic polymers are used as the resist material, indicating that the etching resistance of the resist becomes poor. A further consideration is the problem that the thickness of antireflective film must be increased as mentioned above. Then, etching is an acute problem. There is a need for an antireflective film having a high selective ratio of etching relative to resist, that is, a high etching speed.

Studies have been made on light-absorbing agents for imparting an optimum absorption coefficient to an antireflective film. Anthracene and phenyl type agents are proposed for the KrF and ArF systems, respectively. However, they are also substituent groups having high dry etching resistance as described previously. Even when a polymer backbone having such organic groups as pendants is formulated as a polymer having low etching resistance such as an acrylic resin, a practical limit exists. On the other hand, silicon-containing materials are generally known to have a high etching rate under etching conditions using fluorocarbon gases and provide a high selective ratio relative to the resist. It is then believed that the use of a silicon-containing antireflective film brings about a drastically increased selective ratio in etching. For example, JP-A 11-60735 discloses an antireflective film for KrF exposure comprising a polysilane having pendant phenyl groups, achieving a high selective ratio of etching.

The recent progress toward a higher resolution accelerates the thinning of resist film. As the thickness is reduced, the resist is required to have higher etching resistance. However, improvements in etching resistance are insufficient. One method of pattern transfer for thin film resist is a hard mask method. The hard masks under consideration are SiO films when substrates to be processed are p-Si, and SiN, W—Si and amorphous Si when substrates to be processed are $SiO_2$ films. The hard masks are disrupted in some cases and peeled in other cases. Particularly when the underlay is an insulating film such as $SiO_2$ film, the W—Si or amorphous Si film which is a good conduction film must be peeled. The SiN film which is an insulating film need not be peeled in some cases. However, the SiN film, whose constituent elements are similar to those of $SiO_2$ film, has a drawback that the selective ratio of etching which is an essential function of hard mask is low. Also, a hard mask in the form of a SiON film having the additional function of antireflective film was proposed in SPIE 2000, Vol. 4226, p. 93.

There have been proposed a number of pattern forming processes using silicon-containing polymers as the underlying film below the resist. For example, Japanese Patent No. 3,118,887 and JP-A 2000-356854 disclose a three-layer process involving forming an organic film on a substrate, spin coating silica glass thereon, transferring a resist pattern to the silica glass layer, effecting oxygen gas etching for transferring the pattern to the organic film layer, and finally processing the substrate. JP-A 5-27444, JP-A 6-138664, JP-A 2001-53068, JP-A 2001-92122 and JP-A 2001-343752 disclose silica glass layers serving as an antireflective film as well and silsesquioxane polymer materials. U.S. Pat. No. 6,420,088 discloses a silsesquioxane polymer. JP-A 2003-502449 discloses a material based on a spin-on-glass material, serving as both an antireflective film and a hard mask. However, all these silicon-containing polymers are less storage stable and suffer from the fatal defect that film thickness varies on actual use.

As an example of silica based film, in connection with the dual-damascene manufacture by via-first process, Richard Spear et al. proposed spin-on-glass materials as the antireflective coating/filling material in JP-A 2003-502449, U.S. Pat. Nos. 6,268,457 and 6,506,497. Also a spin-on-glass material having no antireflective effect was proposed as the low-dielectric constant film-forming filling material. The spin-on-glass materials have a high structural similarity to the silica base low-dielectric constant film and raise no problem in pattern shape during fluorocarbon gas dry etching, but fail to establish a selectivity during wet etching and are difficult to control the shape after stripping.

On the other hand, when organic materials are used as the filling material, they tend to generate shape abnormalities in proximity to the interface between the organic film and the low-dielectric constant film during fluorocarbon gas dry etching for low-dielectric constant material processing after the oxygen gas dry etching step.

One of the performance requirements for the antireflective film is to eliminate intermixing with the resist and diffusion of low-molecular-weight components into the resist layer, as discussed in Proc. SPIE Vol. 1, 2195, pp. 225-229 (1994). One effective means taken to prevent intermixing and diffusion is by baking an antireflective film after spin coating for inducing thermal crosslinkage. A resist pattern on the antireflective film or the resist underlying film is desired to have a perpendicular shape without footing or undercut. This is because the footed shape introduces a difference of dimensional conversion after etching of the antireflective film, and the undercut shape causes the resist pattern to collapse after development.

It is reported in Proc. SPIE Vol. 3678, pp. 241-250 (1999) that acid-assisted crosslinkage is effective for restraining the positive resist from footing. The method of adding a crosslinking agent and crosslinking with the aid of acid is important for antireflective materials. JP-A 5-27444 and JP-A 2001-92122 describe that the addition of crosslinking agents is effective.

JP-A 2001-354904 describes a process of preparing a porous film-forming composition in the presence of tetraalkylammonium hydroxide. This composition is to form a silica base interlayer dielectric layer. In Example, the composition is fired at a temperature of 450° C. which is above the decomposition temperature of organic groups. The resulting inorganic film can have a good selective ratio of etching relative to an organic resist film, but the film formation by firing at such a high temperature as to decompose organic groups and relying on non-organic crosslinkage fails to achieve optical and acid-diffusion-preventing functions as intended in the present invention.

The recent demands for semiconductor integrated circuits having higher degrees of integration and higher operating speeds require an interlayer insulating layer having a lower dielectric constant in order to reduce the interconnection capacitance. As the insulating layer having a low dielectric constant, porous films are now under study instead of conventional silicon oxide films. A conventional inorganic silicon film formed on such a porous film cannot be selectively removed because of similar properties.

The inventors discovered in Japanese Patent Application No. 2003-157807 a resin composed mainly of a silicon base material in which acid-catalyzed crosslinking of organofunctional groups provides satisfactory lithographic properties, a satisfactory etching selectivity relative to an organic material, and storage stability. A film formed after crosslinking of organofunctional groups has a higher dry etching resistance than a porous dielectric film, and is difficult to remove by wet etching without causing damage to the porous dielectric film.

SUMMARY OF THE INVENTION

An object of the present invention is to provide a porous film-forming composition which can solve all the above-discussed problems in the processing of silicon-base low-dielectric constant film having a relative permittivity of up to 2.7, a patterning process using the composition, and a porous sacrificial film formed from the composition.

The inventors have discovered that a porous film is produced by effecting hydrolytic condensation of at least one silicon compound selected from the group consisting of a hydrolyzable silane having the general formula (1):

 (1)

wherein $R^1$ is each independently a monovalent organic group or hydrogen, $R^2$ is each independently a hydrolyzable group or a hydroxyl group and n is an integer of 0 to 3, a hydrolyzate thereof and a partial condensate thereof, with the proviso that at least one silicon compound having an organic crosslinkable group as $R^1$ is included, to form a polymer and subjecting the polymer to crosslinking reaction by the organic crosslinkable group, and that the porous film eliminates intermixing with resist and diffusion of low-molecular weight components into a resist layer, establishes a satisfactory etching ratio relative to resist, and provides a selectivity of wet etching relative to another silicone base material due to the effect of organic crosslinked portions. It has also been found that the porous film also has an antireflection function when it has light-absorbing groups and that the rate of wet etching can be enhanced by thermally degrading the organic crosslinked portions.

There is obtained an antireflective film-forming material which has a high selective ratio of etching relative to the resist, i.e., a higher etching rate than the resist, can be removed under conditions that do not damage a low-dielectric constant insulating film, and exhibits a minimized variation of film thickness during long-term storage. There are also obtained a patterning process involving forming an antireflective film on a substrate using this antireflective film-forming material, and a patterning process involving using this antireflective film as a hard mask for substrate processing or as a sacrificial film.

Accordingly, the present invention provides a porous film-forming composition, a patterning process, and a porous sacrificial film, which are defined below.

[1] A porous film-forming composition comprising (A) a polymer obtained by hydrolytic condensation of at least one silicon compound selected from the group consisting of a hydrolyzable silane having the general formula (1), a hydrolyzate thereof and a partial condensate thereof, and (B) an organic solvent.

 (1)

Herein $R^1$ is each independently a monovalent organic group or hydrogen, $R^2$ is each independently a hydrolyzable group or a hydroxyl group and n is an integer of 0 to 3, with the proviso that at least one silicon compound having an organic crosslinkable group as $R^1$ is included. The polymer is capable of crosslinking reaction by the organic crosslinkable group.

[2] The composition of [1], wherein $R^1$ in formula (1) includes a monocyclic or fused polycyclic aromatic hydrocarbon group.

[3] The composition of [2], wherein the monocyclic or fused polycyclic aromatic hydrocarbon group is a group having a benzene ring, naphthalene ring or anthracene ring.

[4] The composition of any one of [1] to [3], wherein the hydrolytic condensation of a silicon compound is performed in the presence of a hydrolytic catalyst which is a quaternary ammonium hydroxide having the general formula (2):

 (2)

wherein $R^3$ is a substituted or unsubstituted monovalent hydrocarbon group of 1 to 4 carbon atoms.

[5] The composition of [4], wherein the quaternary ammonium hydroxide is tetramethylammonium hydroxide.

[6] The composition of any one of [1] to [5], wherein the hydrolyzable silane of formula (1) comprises silanes wherein n=1 and n=0.

[7] The composition of any one of [1] to [6], wherein the hydrolyzable silane of formula (1) comprises a silane having an epoxy group, an alcoholic hydroxyl group or a group which is convertible into an alcoholic hydroxyl group.

[8] The composition of any one of [1] to [7], further comprising an acid generator.

[9] The composition of any one of [1] to [8], further comprising a crosslinking agent.

[10] The composition of any one of [1] to [9], wherein the polymer (A) has a light-absorbing structure incorporated therein.

[11] A process of forming a pattern on a substrate by lithography, comprising the steps of applying the composition of any one of [1] to [9] onto a substrate having a low-dielectric constant material film formed thereon, baking the composition to form a sacrificial film, forming an antireflective film on the sacrificial film, applying a photoresist material, prebaking the material to form a photoresist film, exposing the photoresist film to a circuit pattern of light, developing the photoresist film with a developer to form a resist pattern in the photoresist film, etching the antireflective film, the sacrificial film and the low-dielectric constant material film through the resist pattern serving as a mask, and dissolving away the sacrificial film in a stripping solution, thereby forming a pattern on the substrate.

[12] A process of forming a pattern on a substrate by lithography, comprising the steps of applying the composition of any one of [1] to [9] onto a substrate having a low-dielectric constant material film formed thereon, baking the composition to form a sacrificial film, forming an antireflective film on the sacrificial film, applying a photoresist material, prebaking the material to form a photoresist film, exposing the photoresist film to a circuit pattern of light, developing the photoresist film with a developer to form a resist pattern in the photoresist film, etching the antireflective film, the sacrificial film and the low-dielectric constant material film through the resist pattern serving as a mask, effecting plasma treatment, and dissolving away the sacrificial film in a stripping solution, thereby forming a pattern on the substrate.

[13] A process of forming a pattern on a substrate by lithography, comprising the steps of applying the composition of [10] onto a substrate having a low-dielectric constant material film formed thereon, baking the composition to form a sacrificial film, applying a photoresist material onto the sacrificial film, prebaking the material to form a photoresist film, exposing the photoresist film to a circuit pattern of light, developing the photoresist film with a developer to form a resist pattern in the photoresist film, etching the sacrificial film and the low-dielectric constant material film through the resist pattern serving as a mask, and dissolving away the sacrificial film in a stripping solution, thereby forming a pattern on the substrate.

[14] A process of forming a pattern on a substrate by lithography, comprising the steps of applying the composition of [10] onto a substrate having a low-dielectric constant material film formed thereon, baking the composition to form a sacrificial film, applying a photoresist material onto the sacrificial film, prebaking the material to form a photoresist film, exposing the photoresist film to a circuit pattern of light, developing the photoresist film with a developer to form a resist pattern in the photoresist film, etching the sacrificial film and the low-dielectric constant material film through the resist pattern serving as a mask, effecting plasma treatment, and dissolving away the sacrificial film in a stripping solution, thereby forming a pattern on the substrate.

[15] A porous sacrificial film which is obtained by applying the porous film-forming composition of any one of [1] to [10] onto a substrate and baking the composition.

The porous film-forming composition of the invention has excellent storage stability, filling properties, adhesion, and coating uniformity, and forms a sacrificial film which is effectively dissolvable in a stripping solution. The composition is effective for increasing the precision during processing of ultra low-k (ULK) film.

DESCRIPTION OF THE PREFERRED EMBODIMENTS

Figure 1:
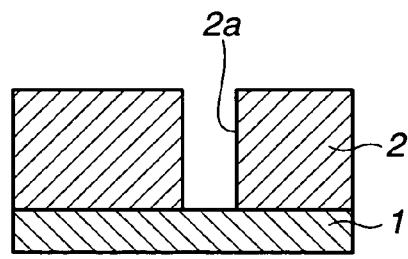
FIG. 1 is a cross-sectional view of a substrate having a patterned low-dielectric constant material film.

The polymer used herein as component (A) is obtainable through hydrolysis and condensation of at least one silicon compound selected from the group consisting of a hydrolyzable silane having the general formula (1), a hydrolyzate thereof and a partial condensate thereof.

$$R^1{}_n-Si-R^2{}_{4-n} \qquad (1)$$

Herein $R^1$ is each independently a monovalent organic group or hydrogen, $R^2$ is each independently a hydrolyzable group or a hydroxyl group and n is an integer of 0 to 3. It is noted that at least one silicon compound having an organic crosslinkable group as $R^1$ should be included in the silicon compound to be hydrolyzed. The resulting polymer is capable of crosslinking reaction by the organic crosslinkable group.

In formula (1), $R^1$ which may be the same or different is a monovalent organic group or hydrogen, but $R^1$ should have at least one crosslinkable group, such as an alcoholic hydroxyl group, carboxyl group, amino group or epoxy group, and preferably an epoxy group, an alcoholic hydroxyl group, or a group which is convertible into an alcoholic hydroxyl group, such as alkoxy. $R^2$ which may be the same or different is a hydrolyzable group or a hydroxyl group, preferably an alkoxy group of 1 to 6 carbon atoms, more preferably methoxy, ethoxy, propoxy or butoxy. The letter n is an integer of 0 to 3.

$R^1$ in formula (1) may have an organic group selected from among monocyclic and fused polycyclic aromatic hydrocarbon groups, preferably an anthracene ring (anthranyl group), naphthalene ring (naphthyl group) or benzene ring (phenyl group) or such a ring having at least one substituent group. These aromatic groups are capable of absorbing light in a wavelength range of 150 to 300 nm.

More particularly, examples of the non-crosslinkable groups represented by $R^1$ in formula (1) include methyl, ethyl, propyl, butyl, pentyl, hexyl, cyclohexyl, cyclopentyl, octyl, norbornyl, chloromethyl, chloroethyl, 3,3,3-trifluoropropyl, trifluoromethyl, 2-cyanoethyl, nonafluorohexyl, thexyl, piperidinomethyl, morpholinomethyl, morpholinopropyl, 3-(2',3'-dimethoxypropyl)propyl, 3-(2'-methoxypropoxy)propyl, 3-(tetrahydrofurfurylalkoxy)propyl, 5-methylcarboxylate norbornyl, 5-t-butylcarboxylate norbornyl, 5,6-dimethoxycyclohexylethyl, and 3-(2',3'-dimethoxypropoxy)propyl, with methyl being most preferred.

The crosslinkable groups represented by $R^1$ in formula (1) include groups having epoxy, amino, mercapto, hydroxy and carbohydroxy groups. Examples include glycidoxypropyl, 2-(3,4-epoxycyclohexyl)ethyl, vinyl, allyl, norbornyl, acrylic, methacryloxypropyl, aminopropyl, 3-(2-aminoethylamino)propyl, 3-mercaptopropyl, 3-hydroxypropyl, 5-hydroxymethylnorbornyl, 5-methoxy-6-hydroxycyclohexylethyl, 3-(2'-methoxy-3'-hydroxypropoxy)propyl, with glycidoxypropyl, 2-(3,4-epoxycyclohexylethyl), 3-hydroxypropyl and 5-hydroxymethylnorbornyl being preferred.

The light absorptive groups represented by $R^1$ in formula (1) include groups having an anthracene ring, naphthalene ring or benzene ring. Among them, a choice is made in accordance with the light absorbing band desired for the antireflective film. Specifically, for the purpose of antireflection at 157 nm and 193 nm, phenyl and naphthyl groups are effective, with examples including phenyl, 4-hydroxyphenyl, 4-methoxyphenyl, 4-t-butoxyphenyl, phenylethyl, 4-hydroxyphenylethyl, 4-methoxyphenylethyl, 4-butoxyphenylethyl and naphthyl. For antireflection at 248 nm, anthracenyl and anthracenemethyl groups are useful.

Examples of the groups represented by $R^2$ in formula (1) include methoxy, ethoxy, propoxy, butoxy, acetoxy, amino and hydroxy groups.

Examples of the silane of formula (1) wherein n=0 include tetramethoxysilane, tetraethoxysilane, tetrabutoxysilane and tetrapropoxysilane.

Among the foregoing silanes, methoxysilanes and ethoxysilanes are preferred for ease of operation and distillation of by-products. The organic silicon compounds which can be used herein are not limited to the foregoing.

The polymer as component (A) must be prepared such that it is capable of crosslinking reaction by the crosslinkable group. To this end, at least one silane (S-1) having a crosslinkable group must be used. It is possible to impart an antireflection function to the polymer (A) by using at least one silane (S-2) having a light-absorbing group to incorporate a light-absorbing structure in the polymer (A). When the polymer is prepared using a silane (S-1) having a crosslinkable group, a silane (S-2) having a light-absorbing group and a silane (S-3) having a non-crosslinkable group, the quantitative ratio of silanes (S-1), (S-2) and (S-3) is determined by taking into account a balance of three factors, light absorption, cure and porosity of the resulting polymer. Where light-absorbing property is required, the ratio of silane (S-2) is determined from the reflectance at a film thickness necessary for etching. The reflectance is, in turn, determined from the molar amount of light-absorbing groups in unit weight of the polymer. If this molar amount is more than 0.3, then the resulting film is likely to become a dense film rather than a porous film. The ratio of silane (S-1) is preferably 0.01 to 0.5. A polymer containing (S-1) in a ratio of less than 0.01 may fail to form a cured film and thus be unsuitable in the intended application. A polymer containing (S-1) in a ratio of more than 0.5 is likely to form a dense film rather than a porous film. The ratio of silane (S-3) is preferably 0.5 to 0.99. A polymer containing (S-3) in a ratio of less than 0.5 is likely to form a dense film which may have a low etching rate.

For the silane (S-3) having a non-crosslinkable group, it is preferred to use a silane of n=0 in combination with a silane of n=1. Porosity is more readily achieved by hydrolysis of a mixture of $Si(OR')_4$ and $R^1Si(OR')_3$ in a molar ratio between 30/70 and 70/30. If $Si(OR')_4$ is more than 70 mol %, the resulting polymer is likely to form a dense film rather than a porous film. With too much $R^1Si(OR')_3$, excessive polymerization may proceed during hydrolysis, giving rise to gelation. Methyl is preferred as $R^1$ for ease of hydrolysis control and porous film formation. For porous film formation, it is also preferred that the solids resulting from $Si(OR')_4$ and $R^1Si(OR')_3$ constitute at least 50% by weight of the entire polymer. If the solids are less than 50% by weight, the resulting polymer tends to have a lower etching rate. It is noted that in these formulae, $R^1$ is as defined above and OR' represents $R^2$.

As long as the above requirements are met, the silicone resin may be prepared by any desired method. Preferably, the silicone resin is prepared by hydrolytic condensation of a silane(s) in the presence of a hydrolytic catalyst which is a quaternary ammonium hydroxide having the general formula (2).

$$[R^3{}_4N]^+OH^- \qquad (2)$$

Herein $R^3$ is a substituted or unsubstituted monovalent hydrocarbon group of 1 to 4 carbon atoms such as methyl, ethyl, propyl, butyl, pentyl or hexyl.

The quaternary ammonium hydroxide of formula (2) is a catalyst for hydrolysis and condensation of the foregoing silane or silanes. Although hydrolytic condensation catalysts for silanes include many acidic and basic catalysts, the use of quaternary ammonium hydroxides ensures formation of a polymer having a porous film-forming ability. Inter alia, tetramethylammonium hydroxide is easily available in the industry as an electronic reagent having a very low metal contamination level of ppb order and thus suitable as a catalyst for the manufacture of electronic industry material. The catalytic amount is usually 1 to 20 mol % based on the silanes. In the presence of less than 1 mol % of the catalyst, the resulting film may have a low dielectric constant, that is, form a more porous film which has a rough surface and is susceptible to cracking. In the presence of more than 20 mol % of the catalyst, a flat film may be obtained, but have a high dielectric constant, that is, become a dense film. For a good compromise between porosity and uniformity of film, the catalytic amount is preferably 5 to 10 mol % based on the silanes.

One specific method of preparing the silicone resin is described below.

In a first stage, one or more of the hydrolyzable organic silane compounds described above are added to a mixture of water and alcohol for effecting hydrolysis and condensation. The amount of water used for hydrolysis is preferably 100 to 5,000 parts by weight per 100 parts by weight of the silane compound or a mixture of silane compounds formulated to a composition satisfying the above-described requirements. With less than 100 pbw of water, the concentration of starting silanes is too high to control condensation reaction, resulting in gels. With more than 5,000 pbw of water, the concentration of starting silanes may be so low to retard condensation reaction. Of the alcohols, lower alcohols having 1 to 4 carbon atoms are preferred for ease of reaction control. Water and alcohol are mixed in a weight ratio between 10/90 and 90/10. At a lower water ratio, hydrolysis may not fully proceed and reaction may stop at an oligomer state, failing to form a porous film. With too much water, condensation will proceed over to a sol state, failing to form a uniform film.

Utilizing the basic conditions, a functional group on silane may be altered into a crosslinkable functional group. Such groups to be altered include hydroxyl, hydroxycarbonyl and amino groups which are protected with alkyl, silyl or ester groups. Illustrative protective groups include, but are not limited to, methyl, ethyl, propyl, butyl, t-butyl, furfurylalkyl, phenyl, benzyl, diphenylmethyl, methoxymethyl, ethoxymethyl, propoxymethyl, methoxyethyl, 1-ethoxyethyl, 1-methyl-1-methoxyethyl, 1-isopropoxyethyl, 3,3,3-trichloroethyl, methoxypropyl, ethoxypropyl, propoxypropyl, dimethoxypropyl, 2,2,2-trichloroethoxymethyl, 2-(trimethylsilyl)ethoxymethyl, tetrahydropyranyl, 3-bromotetrahydropyranyl, 4-methoxytetrahydropyranyl, trimethylsilyl, triethylsilyl, isopropyldimethylsilyl, t-butyldimethylsilyl, t-butyldiphenylsilyl, formyl, acetyl, 3-phenylpropionate, 3-benzoylpropionate, isobutyrate, 4-oxopentanoate, pivaloate, adamantoato, benzoate, methoxycarbonyl, ethoxycarbonyl, 2,2,2-trichloroethoxycarbonyl, isobutyloxycarbonyl, and benzylcarbonate. Upon elimination of these protective groups, the protected groups are converted back to hydroxyl, hydroxycarbonyl and amino groups.

Examples of the quaternary ammonium hydroxide serving as the hydrolysis/condensation catalyst include tetramethylammonium hydroxide, ethyltrimethylammonium hydroxide, propyltrimethylammonium hydroxide, butyltrimethylammonium hydroxide, pentyltrimethylammonium hydroxide, hexyltrimethylammonium hydroxide, diethyldimethylammonium hydroxide, dipropyldimethylammonium hydroxide, dibutyldimethylammonium hydroxide, triethylmethylammonium hydroxide, tripropylmethylammonium hydroxide, and tributylmethylammonium hydroxide. Of these, tetramethylammonium hydroxide in water is preferred for ease of availability. An appropriate amount of quaternary ammonium hydroxide used is 0.1 to 100 mol % based on the moles of silanes. Less than 0.1 mol % is impractical because of slow hydrolytic condensation reaction. More than 100 mol % provides no additional benefits and is impractical because of expense and complication of post neutralization.

The temperature for hydrolytic condensation reaction, which varies with the composition and concentration of silanes, solvent composition and catalytic amount, is preferably such that the system remains homogeneous in order for uniform reaction to take place. The preferred temperature is above the freezing point and below the boiling point of the solvent.

A second stage is to remove the catalyst from the reaction mixture. First of all, the catalyst is neutralized and deactivated to interrupt the condensation reaction. For neutralization, any of inorganic or organic acids and solid acids may be used. Preferred are organic acids purified for electronic material use. Also, utilizing neutral or acidic conditions, a functional group on silane may be altered into a crosslinkable functional group. Such groups to be altered include hydroxyl, hydroxycarbonyl and amino groups which are protected with alkyl, silyl or ester groups. Illustrative protective groups include, but are not limited to, methyl, ethyl, propyl, butyl, t-butyl, furfurylalkyl, phenyl, benzyl, diphenylmethyl, methoxymethyl, ethoxymethyl, propoxymethyl, methoxyethyl, 1-ethoxyethyl, 1-methyl-1-methoxyethyl, 1-isopropoxyethyl, 3,3,3-trichloroethyl, methoxypropyl, ethoxypropyl, propoxypropyl, dimethoxypropyl, 2,2,2-trichloroethoxymethyl, 2-(trimethylsilyl)ethoxymethyl, tetrahydropyranyl, 3-bromotetrahydropyranyl, 4-methoxytetrahydropyranyl, trimethylsilyl, triethylsilyl, isopropyldimethylsilyl, t-butyldimethylsilyl, t-butyldiphenylsilyl, formyl, acetyl, 3-phenylpropionate, 3-benzoylpropionate, isobutyrate, 4-oxopentanoate, pivaloate, adamantoato, benzoate, methoxycarbonyl, ethoxycarbonyl, 2,2,2-trichloroethoxycarbonyl, isobutyloxycarbonyl, and benzylcarbonate.

The silane reaction mixture-containing solution resulting from the second stage is then heated under atmospheric pressure and at a temperature of up to 80° C., or under a reduced pressure of 1 hPa to atmospheric pressure and at a temperature of room temperature to 80° C., thereby distilling off the alcohol used as the solvent and hydrolytic by-products. As a result, the silane reaction mixture-containing solution is converted into a system consisting essentially of a silicone polymer, water, and the neutralized salt of quaternary ammonium hydroxide. In the process, an organic solvent in which the polymer is dissolvable may be added before or after the distillation step. Suitable solvents include, but are not limited to, pentane, hexane, heptane, octane, benzene, toluene, xylene, acetone, methanol, ethanol, butanol, ethylene glycol monobutyl ether, diethylene glycol monobutyl ether, triethylene glycol monobutyl ether, tetraethylene glycol monobutyl ether, ethylene glycol monohexyl ether, diethylene glycol monohexyl ether, diethylene glycol mono-2-ethylhexyl ether, ethylene glycol monobutyl ether acetate, diethylene glycol monobutyl ether acetate, 2-methoxyethyl acetate, propylene glycol monomethyl ether, propylene glycol monoethyl ether, propylene glycol monopropyl ether (PnP), propylene glycol monobutyl ether, dipropylene glycol monomethyl ether, propylene glycol monomethyl ether acetate (PGMEA), propylene glycol monoethyl ether acetate, propylene glycol-1,2-dimethyl ether, propylene glycol diacetate, methyl methoxyacetate, dimethyl ketone, cyclohexanone, diisobutyl ketone, ethyl acetate, butyl acetate, 2-methylpropyl acetate, 3-methylbutyl acetate, ethyl lactate, methyl 3-methoxypropionate, cyclopentyl methyl ether, 4-hydroxy-4-methyl-2-pentanone, 3,5,5-trimethyl-1-hexanol, diethyl ether, dibutyl ether, and THF.

After the concentration, an organic solvent is added to the concentrate whereupon the water layer is separated. Where the concentrate is separated into organic and water layers due to the addition of an organic solvent prior to the concentration, the addition of an organic solvent at this point is optional. The solvent to be added is not particularly limited as long as the water layer is separable. Suitable solvents include, but are not limited to, pentane, hexane, heptane, octane, benzene, toluene, xylene, acetone, methanol, ethanol, butanol, ethylene glycol monobutyl ether, diethylene glycol monobutyl ether, triethylene glycol monobutyl ether, tetraethylene glycol monobutyl ether, ethylene glycol monohexyl ether, diethylene glycol monohexyl ether, diethylene glycol mono-2-ethylhexyl ether, ethylene glycol monobutyl ether acetate, diethylene glycol monobutyl ether acetate, 2-methoxyethyl acetate, propylene glycol monomethyl ether, propylene glycol monoethyl ether, propylene glycol monopropyl ether, propylene glycol monobutyl ether, dipropylene glycol monomethyl ether, propylene glycol monomethyl ether acetate (PGMEA), propylene glycol monoethyl ether acetate, propylene glycol-1,2-dimethyl ether, propylene glycol diacetate, methyl methoxyacetate, dimethyl ketone, cyclohexanone, diisobutyl ketone, ethyl acetate, butyl acetate, 2-methylpropyl acetate, 3-methylbutyl acetate, ethyl lactate, methyl 3-methoxypropionate, cyclopentyl methyl ether, 4-hydroxy-4-methyl-2-pentanone, 3,5,5-trimethyl-1-hexanol, diethyl ether, dibutyl ether, and THF.

After the water layer is separated, the organic layer is preferably washed with water. The washing step removes the neutralized salt of quaternary ammonium hydroxide used as the condensation catalyst, the excess of the acid used for neutralization, and any metal ions incidentally introduced during the process.

In the silicone polymer solution from which the water layer has been separated, the solvent may be exchanged by any desired solvent. The new solvent is not particularly limited and may be selected from the above-listed solvents used in the step of separating the water layer. The organic solvent is preferably used in an amount of 100 to 5,000 parts by weight per 100 parts by weight of the polymer.

In the crosslinkable group-containing polymer resulting from hydrolysis, a compound having an organic group selected from among monocyclic and fused polycyclic aromatic hydrocarbon groups may be added to some of the crosslinkable groups. This addition reaction may be done at any stage after the hydrolysis. The organic groups participating in that addition include hydroxyl, hydroxycyanate, isocyanate, carboxyl, carbon-to-carbon double bond groups such as vinyl, amino, and halide groups. The monocyclic and fused polycyclic aromatic hydrocarbon groups are preferably compounds having a benzene, naphthalene or anthracene ring. Exemplary compounds include, but are not limited to, phenol, 2-naphthol, 9-methanolanthracene, benzoic acid, naphthoic acid, and 9-anthracenecarboxylic acid.

The silicone resin used herein is typically prepared by the foregoing method. However, silicone resins prepared by any other methods may be used as long as the resins fall in the range of the invention. That is, the silicone resin is not limited by its preparation method.

In the composition of the invention, an acid generator for promoting thermal crosslinking reaction is preferably added because it is effective for preventing mixing of the composition with resist and migration and diffusion of low-molecular weight substances. The acid generators include thermal acid generators which generate acid upon thermal decomposition and photoacid generators which generate acid upon light exposure. Either of them may be added.

The acid generators used herein include
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1a-3):

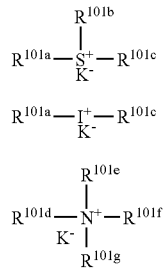

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbotnyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

The salts of (P1a-1) and (P1a-2) have both the functions of a photoacid generator and a thermal acid generator while the salts of (P1a-3) function as a thermal acid generator.

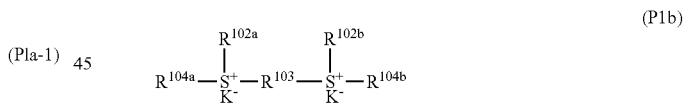

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

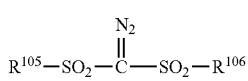

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

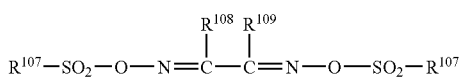

Herein, $R^{107}$ $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

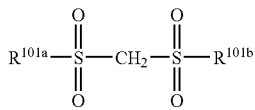

Herein, $R^{101a}$ and $R^{101b}$ are as defined above.

(v) Sulfonic Acid Esters of N-Hydroxyimide Compounds of Formula (P5)

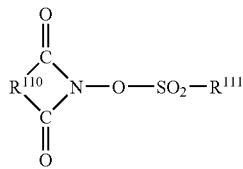

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), heteroaromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as tetramethylammonium trifluoromethanesulfonate, tetramethylammonium nonafluorobutanesulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethane-sulfonate, bis(p-tert-butoxyphenyl)phenylsulfonium trifluoromethane-sulfonate, tris(p-tert-butoxyphenyl)sulfonium trifluoromethane-sulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethane-sulfonate, cyclohexylmethyl(2-oxocyclohexyl)sulfonium trifluoromethane-sulfonate, (2-norbornyl)methyl(2-oxocyclohexyl)sulfonium trifluoro-methanesulfonate, ethylenebis[methyl(2-oxocyclopentyl)sulfonium trifluoro-methane-sulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

(d) bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethane-sulfonate, tris(p-tert-butoxyphenyl)sulfonium trifluoromethane-sulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethane-sulfonate, (2-norbornyl)methyl(2-oxocylohexyl)sulfonium trifluoro-methanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combinations of two or more thereof.

The acid generator is preferably added in an amount of 0.001 to 5 parts by weight, and especially 0.5 to 2 parts by weight, per 100 parts by weight of component (A).

When a film is formed from the inventive composition, crosslinks form between organic groups attached to the polymer. This crosslink formation may take place either by direct reaction between organic groups attached to the polymer or via an additive component having a plurality of functional groups capable of reacting with organic groups, a so-called crosslinking agent. The former type relying on only the direct bonding between organic groups attached to the polymer without using a low molecular weight crosslinking agent eliminates, during formation of resist film in a pattern forming process, the concern that the crosslinking agent diffuses and migrates from the antireflective layer to the resist layer to adversely affect the pattern shape. This allows for relatively free selection of temperature and other conditions of the resist film forming step. In this sense, it is preferred that the crosslinking agent other than the polymer is not used.

On the other hand, in the patterning process of the invention, it is important to control a crosslinking density. For fine adjustment of a crosslinking density, the composition having the crosslinking agent added thereto has the advantage of easy adjustment. In an alternative procedure, the composition is once formulated as being essentially free of a crosslinking agent, and a crosslinking agent is added thereto for final adjustment.

Examples of the crosslinking agent which can be used herein include melamine compounds, guanamine compounds, glycoluril compounds, urea compounds, epoxy compounds, thioepoxy compounds, isocyanate compounds, azide compounds and compounds having a double bond such as alkenyl ether group, which are substituted with at least one group selected from among methylol, alkoxymethyl, and acyloxymethyl groups. They may be either used as the additive or incorporated into polymer side chains as pendant groups. Compounds having hydroxyl groups are also useful crosslinking agents.

Examples of the epoxy compound include tris(2,3-epoxypropyl)isocyanurate, trimethylolmethane triglycidyl ether, trimethylolpropane triglycidyl ether, and triethylolethane triglycidyl ether.

Examples of the melamine compound include hexamethylolmelamine, hexamethoxymethylmelamine, hexamethylolmelamine in which 1 to 6 methylol groups are methoxymethylated and mixtures thereof, hexamethoxyethylmelamine, hexaacyloxymethylmelamine, and hexamethylolmelamine in which 1 to 6 methylol groups are acyloxymethylated and mixtures thereof.

Examples of the guanamine compound include tetramethylolguanamine, tetramethoxymethylguanamine, tetramethylolguanamine in which 1 to 4 methylol groups are methoxymethylated and mixtures thereof, tetramethoxyethylguanamine, tetraacyloxyguanamine, and tetramethylolguanamine in which 1 to 4 methylol groups are acyloxymethylated and mixtures thereof.

Examples of the glycoluril compound include tetramethylolglycoluril, tetramethoxyglycoluril, tetramethoxymethylglycoluril, tetramethylolglycoluril in which 1 to 4 methylol groups are methoxymethylated and mixtures thereof, and tetramethylolglycoluril in which 1 to 4 methylol groups are acyloxymethylated and mixtures thereof.

Examples of the urea compound include tetramethylolurea, tetramethoxymethylurea, tetramethylolurea in which 1 to 4 methylol groups are methoxymethylated and mixtures thereof, and tetramethoxyethylurea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentylglycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

In an embodiment wherein the polymer contains epoxy as the crosslinkable group, it is effective for enhancing reactivity with epoxy and improving crosslinking efficiency to add a compound having a hydroxyl group. Compounds having two or more hydroxyl groups in a molecule are preferred. Examples include alcohol group-containing compounds such as 4,8-bis(hydroxymethyl)tricyclo[5.2.1.0$^{2,6}$]-decane, pentaerythritol, 1,2,6-hexanetriol, 4,4',4"-methylidenetriscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy;

low-nucleus phenol compounds such as bisphenol, methylenebisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidenebisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylenebis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4"-methylidenetrisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4"-ethylidynetris[2-methylphenol], 4,4',4"-ethylidynetrisphenol, 4,6-bis[(4-hydroxyphenyl)methyl]-1,3-benzenediol, 4,4'-[(3,4-dihydroxyphenyl)methylene]bis[2-methylphenol], 4,4',4",4'''-(1,2-ethanediylidene)tetrakisphenol, 4,4',4",4'''-(1,2-ethanediylidene)tetrakis[2-methylphenol], 2,2'-methylenebis[6-[(2-hydroxy-5-methylphenyl)methyl]-4-methylphenol], 4,4',4",4'''-(1,4-phenylenedimethylidyne)tetrakisphenol, 2,4,6-tris(4-hydroxyphenylmethyl)-1,3-benzenediol, 2,4',4"-methylidenetrisphenol, 4,4',4"-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol, 2,2'-methylenebis[6-[(3,5-dimethyl-4-hydroxyphenyl)methyl]-4-methylphenol, 4,4',4",4'''-tetrakis[(1-methylethylidene)bis(1,4-cyclo-hexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

An appropriate amount of the crosslinking agent added is 0.01 to 20 parts, preferably 0.01 to 10 parts by weight per 100 parts by weight of component (A). Less amounts may cause insufficient crosslinking, allowing intermixing with the resist. If the crosslinking agent is used in too much amounts, an excess portion of the agent having not participating in crosslinking can migrate to and adversely affect the resist layer.

In another aspect, the present invention provides a process of forming a pattern in a substrate by lithography, comprising the steps of applying a porous sacrificial film-forming composition, as defined above, onto a substrate to form a porous sacrificial film, forming an antireflective film on the porous sacrificial film when a light-absorbing structure is not incorporated in the polymer in the composition, applying a photoresist material, prebaking the material to form a photoresist film, exposing the photoresist film to a circuit pattern of light, developing the photoresist film with a developer to form a resist pattern in the photoresist film, etching the antireflective film, the sacrificial film and the substrate through the resist pattern serving as a mask, optionally effecting plasma treatment, and dissolving away the sacrificial film in a stripping solution, thereby forming a pattern in the substrate.

Referring to the figures, a process of forming a pattern using the porous film-forming composition of the invention is described.

First, as shown in FIG. 1, a patterned low-dielectric constant material film 2 is formed on a substrate 1. The substrate used herein may be a silicon wafer, a silicon wafer having a SiN film formed thereon, or a silicon wafer having a SiO film formed thereon. The low-dielectric constant material film may be a SiO film deposited by CVD of organic reactants, or a porous SiO film formed by a spin coating technique.

The patterned low-dielectric constant material film is formed on the substrate by any desired method, for example, by forming an antireflective film on a low-dielectric constant film, forming a resist film thereon, exposing a circuit pattern region of the resist film to light, developing the resist film with a developer to form a resist pattern therein, treating the antireflective film and the low-dielectric constant film with a plasma through the patterned resist film serving as a mask, and wet etching the resist film and the antireflective film for removal. The thickness of the low-dielectric constant film may be suitably selected and is typically 10 to 500 µm.

Figure 2:
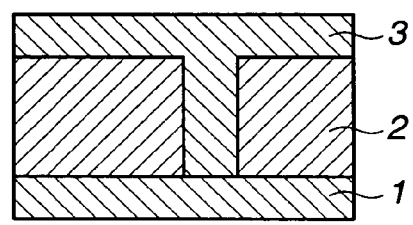
FIG. 2 is a cross-sectional view of a sacrificial film formed on the low-dielectric constant material film.

Then, as shown in FIG. 2, the porous film-forming composition of the invention is applied and dried to form a sacrificial film 3 on the low-dielectric constant film 2. The thickness of the sacrificial film may also be suitably selected and is typically in a range of 10 to 1,000 µm, preferably 50 to 500 µm. After the composition is applied as by spin coating, the organic solvent is evaporated off and the resulting coating is preferably baked to promote crosslinking reaction in order to prevent the sacrificial film from mixing with the overlying antireflective film. Preferred baking conditions include a temperature of 80 to 200° C. and a time of 10 to 300 seconds.

Figure 3:
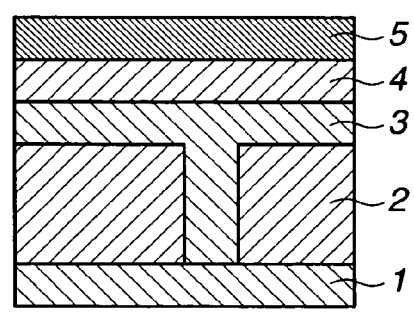
FIG. 3 is a cross-sectional view of an antireflective film and a photoresist film formed on the sacrificial film.

Next, as shown in FIG. 3, an antireflective film 4 is formed on the sacrificial film 3, and a photoresist material is then applied and prebaked to form a photoresist film 5. For the antireflective film 4 and the photoresist film 5, well-known materials may be used, the films may be formed by conventional techniques, and their thickness may be suitably selected.

After the antireflective film material is applied as by spin coating, the organic solvent is evaporated off and the resulting coating is preferably baked to promote crosslinking reaction in order to prevent the antireflective film from mixing with the overlying resist film. The photoresist film is formed on the antireflective film, preferably by spin coating as in the case of antireflective film. After the photoresist film material is applied as by spin coating, it is prebaked. Preferred prebaking conditions include a temperature of 80 to 200° C. and a time of 10 to 300 seconds.

Figure 4:
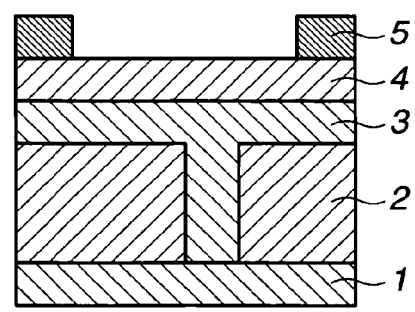
FIG. 4 is a cross-sectional view of a patterned photoresist film.
Figure 5:
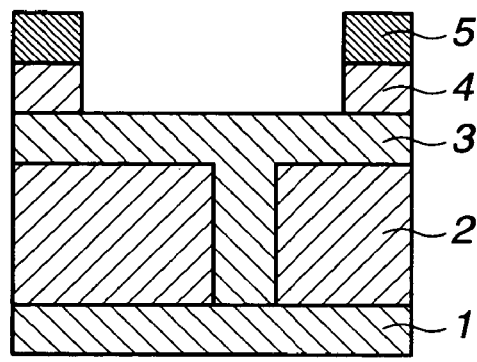
FIG. 5 is a cross-sectional view of a patterned antireflective film.

Then, the photoresist film 5 is exposed to a circuit pattern of light in a conventional manner, and developed with a developer liquid to form a pattern in the photoresist film 5, as shown in FIG. 4. Then, as shown in FIG. 5, using the patterned photoresist film 5 as a mask, dry etching is carried out to form a pattern in the antireflective film 4. The dry etching used herein is preferably etching with a fluorochemical gas plasma using a source gas such as $CF_4$ or $C_2F_6$.

Figure 6:
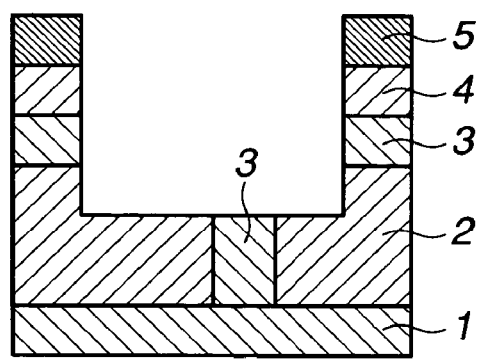
FIG. 6 is a cross-sectional view of a patterned sacrificial film/low-dielectric constant material film structure.

Next, as shown in FIG. 6, the sacrificial film 3 and low-dielectric constant material film 2 are treated with a plasma to form a pattern therein. The plasma treatment used herein may be dry etching using a source gas such as oxygen, $CF_4$, $C_2F_6$, hydrogen, argon or helium.

Figure 7:
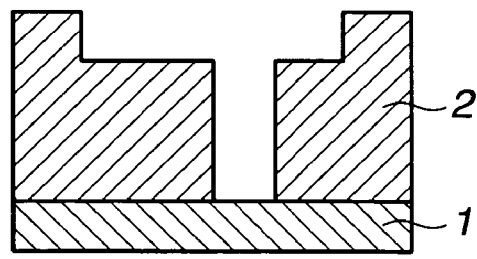
FIG. 7 is a cross-sectional view of a structure after the photoresist film, antireflective film and sacrificial film are removed.

Thereafter, as shown in FIG. 7, the residues of the photoresist film 5, antireflective film 4 and sacrificial film 3 are removed using a stripping solution.

It is noted that before the sacrificial film is dissolved away in a stripping solution, the sacrificial film may be plasma treated to induce surface modification to promote the dissolution. The plasma treatment used herein may be dry etching using a source gas such as oxygen, $CF_4$, $C_2F_6$, hydrogen, argon or helium.

In an embodiment wherein the porous sacrificial film has light-absorbing properties, the antireflective film is unnecessary. The process follows the steps of FIGS. 8 to 13. These steps are the same as in FIGS. 1 to 7 except that the steps of forming and removing the antireflective film are eliminated. Namely, a photoresist film 5 is formed directly on a sacrificial film 3 as shown in FIG. 10. The photoresist film 5 is patterned as shown in FIG. 11. The sacrificial film 3 and low-dielectric constant material film 2 are dry etched as shown in FIG. 12.

Figure 8:
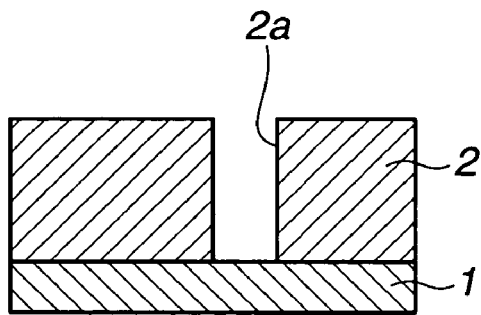
FIG. 8 is a cross-sectional view of a substrate having a patterned low-dielectric constant material film.
Figure 9:
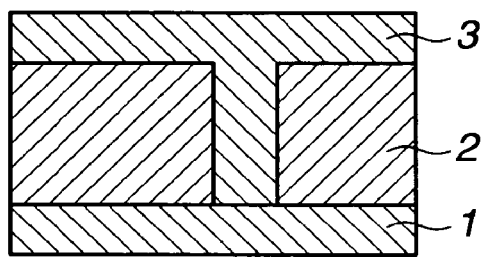
FIG. 9 is a cross-sectional view of a sacrificial film formed on the low-dielectric constant material film, the sacrificial film having a UV-absorbing structure incorporated therein.
Figure 10:
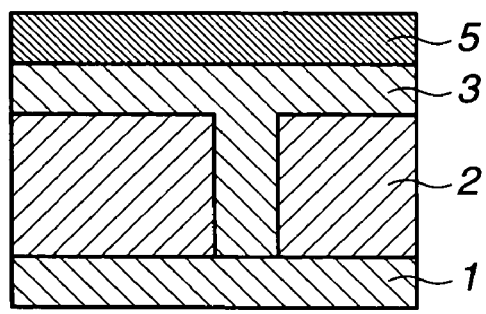
FIG. 10 is a cross-sectional view of a photoresist film formed on the sacrificial film.
Figure 11:
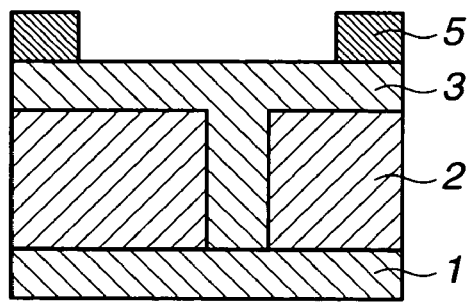
FIG. 11 is a cross-sectional view of a patterned photoresist film.
Figure 12:
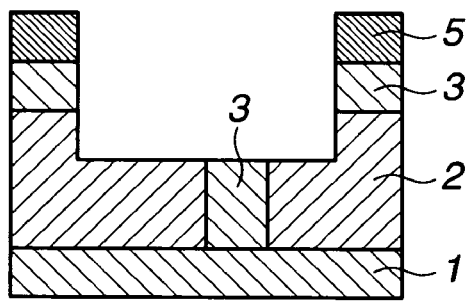
FIG. 12 is a cross-sectional view of a patterned sacrificial film/low-dielectric constant material film structure.
Figure 13:
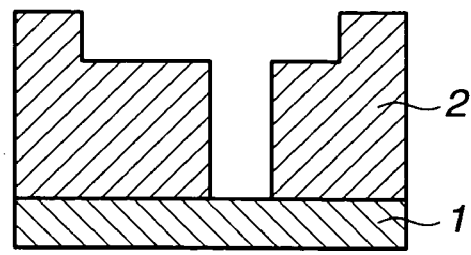
FIG. 13 is a cross-sectional view of a structure after the photoresist film and sacrificial film are removed.

More particularly, FIGS. 8 to 13 illustrates how to form a pattern when the porous sacrificial film has a light-absorbing structure incorporated therein, i.e., possesses an antireflective function. First, on a patterned low-dielectric constant film 2 as shown in FIG. 8, a porous film-forming composition having antireflective function is applied as by spin coating, forming a porous antireflective/sacrificial film 3 (FIG. 9). After the composition is applied as by spin coating, the organic solvent is evaporated off and the resulting coating is preferably baked to promote crosslinking reaction in order to prevent the film from mixing with the overlying photoresist film. Preferred baking conditions include a temperature of 80 to 200° C. and a time of 10 to 300 seconds.

As shown in FIG. 10, a photoresist film 5 is then formed on the antireflective/sacrificial film 3, preferably by spin coating as in the case of antireflective film. After the photoresist film material is applied as by spin coating, it is prebaked. Preferred prebaking conditions include a temperature of 80 to 200° C. and a time of 10 to 300 seconds.

Then, the photoresist film 5 is exposed to a circuit pattern of light in a conventional manner, post-exposure baked (PEB), and developed with a developer liquid to form a resist pattern, as shown in FIG. 11. Then, by dry etching, the resist pattern is transferred to the porous antireflective/sacrificial film and low-dielectric constant film as shown in FIG. 12. Finally, the photoresist film 5 used as the mask, the layer portion of porous antireflective/sacrificial film 3 and the portion of porous antireflective/sacrificial film 3 filling in the bore in the low-dielectric constant film 2 are removed by wet stripping.

For the photoresist film 5, there may be used any well-known resist material, for example, a composition comprising a base resin, a photoacid generator and an organic solvent. A suitable base resin is at least one polymer selected from the class consisting of polyhydroxystyrene and derivatives thereof, polyacrylic acid and derivatives thereof, polymethacrylic acid and derivatives thereof, copolymers of hydroxystyrene and acrylic acid or a derivative thereof, ternary or more copolymers of cycloolefin or a derivative thereof, maleic anhydride, and acrylic acid or a derivative thereof, ternary or more copolymers of cycloolefin or a derivative thereof, maleimide, and acrylic acid or a derivative thereof, polynorbornene, and metathesis ring-opening polymers. The term "derivatives" used herein refer to those compounds in which the main skeleton is left after derivation, for example, acrylic acid derivatives include acrylic acid esters and the like, methacrylic acid derivatives include methacrylic acid esters and the like, and hydroxystyrene derivatives include alkoxystyrenes and the like.

EXAMPLE

Preparation Examples, Working Examples and Comparative Examples are given below for illustrating the present invention. The invention is not limited to the Examples. Abbreviations have the following meaning; PGMEA is propylene glycol monomethyl ether acetate, PnP is propylene glycol monopropyl ether, and TMAH is tetramethylammonium hydroxide.

Preparation Example 1

A 5-liter flask was charged with 1,135 g of ultrapure water, 1,135 g of ethanol and 83 g of a 10% TMAH aqueous solution. In a nitrogen atmosphere and at 30° C., a mixture of 51 g of methyltrimethoxysilane, 78 g of tetraethoxysilane, 24 g of phenyltrimethoxysilane, and 54 g of 3,4-epoxycyclohexylethyltrimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 1,200 g of PnP. This solution was concentrated in a vacuum of 20 hPa, yielding 1,000 g of Polymer 1 solution. The nonvolatile content was 11.0 wt %.

Preparation Example 2

A 5-liter flask was charged with 1,135 g of ultrapure water, 1,135 g of ethanol and 83 g of a 10% TMAH aqueous solution. In a nitrogen atmosphere and at 30° C., a mixture of 51 g of methyltrimethoxysilane, 79 g of tetraethoxysilane, 24 g of phenyltrimethoxysilane, and 52 g of glycidoxypropyl-trimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 1,200 g of PnP. This solution was concentrated in a vacuum of 20 hPa, yielding 950 g of Polymer 2 solution. The nonvolatile content was 10.5 wt %.

Preparation Example 3

A 5-liter flask was charged with 1,135 g of ultrapure water, 1,135 g of ethanol and 83 g of a 10% TMAH aqueous solution. In a nitrogen atmosphere and at 30° C., a mixture of 165 g of tetraethoxysilane, 24 g of phenyltrimethoxysilane, and 54 g of glycidoxypropyltrimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 1,200 g of PnP. This solution was concentrated in a vacuum of 20 hPa, yielding 1,000 g of Polymer 3 solution. The nonvolatile content was 9.5 wt %.

Preparation Example 4

A 5-liter flask was charged with 1,135 g of ultrapure water, 1,135 g of ethanol and 83 g of a 10% TMAH aqueous solution. In a nitrogen atmosphere and at 30° C., a mixture of 51 g of methyltrimethoxysilane, 78 g of tetraethoxysilane, and 54 g of 3,4-epoxycyclohexylethyltrimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 300 g of PGMEA. This solution was concentrated in a vacuum of 20 hPa, yielding 1,100 g of Polymer 4 solution. The nonvolatile content was 8.5 wt %.

Preparation Example 5

A 118-g portion of the PGMEA solution obtained in Preparation Example 4 was placed in a 1-liter flask, to which 1.24 g of anthracene-9-carboxylic acid was added. Reaction was effected at 100° C. for 24 hours. At the end of reaction, the solvent was completely distilled off in a vacuum of 20 hPa, 500 g of ethyl acetate was added to the residue for dissolution, and 200 g of ultrapure water was added for washing, which procedure was repeated five times. To the organic layer was added 100 g of PGMEA. This solution was concentrated in a vacuum of 20 hPa, yielding 98 g of Polymer 5 solution. The nonvolatile content was 11.5 wt %.

Preparation Example 6

A 5-liter flask was charged with 1,135 g of ultrapure water, 1,135 g of ethanol and 415 g of a 10% TMAH aqueous solution. In a nitrogen atmosphere and at 30° C., a mixture of 51 g of methyltrimethoxysilane, 78 g of tetraethoxysilane, 24 g of phenyltrimethoxysilane, and 81 g of 3-acetoxypropyl-trimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 1,200 g of PnP. This solution was concentrated in a vacuum of 20 hPa, yielding 1,100 g of Polymer 6 solution. The nonvolatile content was 9.3 wt %.

Preparation Example 7

A 5-liter flask was charged with 1,135 g of ultrapure water, 1,135 g of ethanol and 4 g of dimethylamine. In a nitrogen atmosphere and at 30° C., a mixture of 51 g of methyltrimethoxysilane, 79 g of tetraethoxysilane, 24 g of phenyltrimethoxysilane, and 52 g of glycidoxypropyl-trimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 1,200 g of PnP. This solution was concentrated in a vacuum of 20 hPa, yielding 1,100 g of Polymer 7 solution. The nonvolatile content was 10.0 wt %.

Preparation Example 8

A 5-liter flask was charged with 1,135 g of ultrapure water, 1,135 g of ethanol and 83 g of a 10% TMAH aqueous solution. In a nitrogen atmosphere and at 30° C., a mixture of 82 g of methyltrimethoxysilane, 125 g of tetraethoxysilane, and 38 g of phenyltrimethoxysilane was added and thoroughly mixed. After one hour, 5.5 g of acetic acid and then 880 g of PGMEA were added to the reaction solution, from which ethanol and methanol were distilled off in a vacuum of 100 hPa. To the residue was added 600 g of ethyl acetate. The water layer was separated off, and the organic layer was washed with 600 g of ultrapure water, which procedure was repeated three times. To the organic layer was added 1,200 g of PnP. This solution was concentrated in a vacuum of 20 hPa, yielding 1,000 g of Polymer 8 solution. The nonvolatile content was 10.5 wt %.

Preparation Example 9

A 5-liter flask was charged with 123 g of acetone, 72 g of ultrapure water, 297 g of isopropanol and 0.6 g of a 0.1M nitric acid aqueous solution. In a nitrogen atmosphere and at 30° C., a mixture of 209 g of tetraethoxysilane and 17 g of phenyltrimethoxysilane was added and thoroughly mixed. Heating under reflux for 4 hours yielded 700 g of Polymer 9 solution. The nonvolatile content was 10.0 wt %.

Preparation Example 10

A 1-liter flask was charged with 59.5 g of ultrapure water, 119 g of ethanol and 59.5 g of a 1% maleic acid aqueous solution. In a nitrogen atmosphere and at 40° C., a mixture of 8 g of phenyltrimethoxysilane and 41 g of 3,4-epoxycyclohexylethyltrimethoxysilane was added and thoroughly mixed. After 4 hours, the reaction solution was distilled of ethanol and methanol in a vacuum of 100 hPa. 200 g of ethyl acetate was added to the residue, and 50 g of ultrapure water was added for washing, which procedure was repeated three times. To the organic layer was added 200 g of PGMEA. This solution was concentrated in a vacuum of 20 hPa, yielding 180 g of Polymer 10 solution. The nonvolatile content was 15.0 wt %.

Preparation Example 11

A 5-liter flask was charged with 915 g of ultrapure water, 1,884 g of ethanol and 103 g of a 10% TMAH aqueous solution. In a nitrogen atmosphere and at 40° C., a mixture of 434 g of methyltrimethoxysilane and 662 g of tetraethoxysilane was added and thoroughly mixed. After 4 hours, 10 g of acetic acid and then 1,800 g of PGMEA were added to the reaction solution, from which ethanol and methanol were distilled off in a vacuum of 100 hPa. To the residue was added 1,200 g of ethyl acetate. The water layer was separated off, and the organic layer was washed with 1,200 g of ultrapure water, which procedure was repeated three times. To the organic layer was added 2,400 g of PnP. This solution was concentrated in a vacuum of 20 hPa, yielding 2,400 g of Polymer 11 solution. The nonvolatile content was 16.4 wt %.

Examples 1-7 & Comparative Examples 1-3

An antireflective film material was prepared by adding an acid generator and crosslinker to each of the polymer solutions prepared in Preparation Examples 1 to 11, according to the recipe shown in Table 1, diluting with a solvent to a solid content (polymer+acid generator+crosslinker) of 10 wt %, and passing through a PTFE filter membrane having a pore diameter of 0.1 μm.

The components shown in Table 1 are identified below.

Polymers 1 to 11: polymers prepared in Preparation Examples 1 to 11

Crosslinker: CR1 of the Formula Below

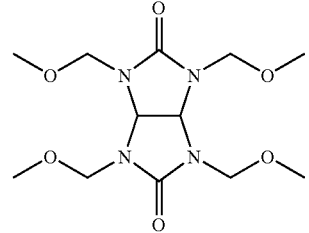

CR1

Acid Generator: AG1 of the Formula Below

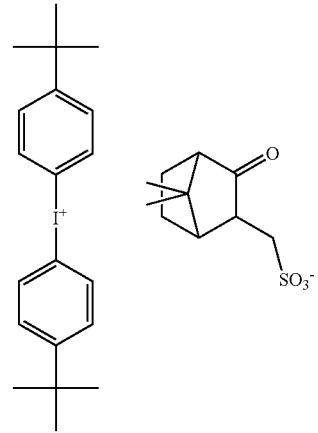

AG1

Organic Solvent: PGMEA or PnP

The antireflective film material thus prepared was applied to a silicon substrate and baked at 200° C. for 120 seconds to form an antireflective film of 193 nm thick.

After the antireflective film was formed, its refractive index (n, k) at a wavelength of 193 nm or 248 nm was measured using a variable incident angle spectral ellipsometer (VASE) by J. A. Woollam, with the results shown in Table 1.

A sample was scraped from the antireflective film and analyzed for nitrogen adsorption surface area using an analyzer Autosorb-1 by Quantachrome Instruments. An average pore size, an adsorption surface area and a proportion of adsorption surface area with a pore size of up to 2 nm were determined, with the results shown in Table 1.

TABLE 1

| Polymer solution | | Composition (wt %) | | | | Refractive index @193 nm | | Film thickness (nm) | Average pore size (nm) | Adsorption surface area (m²/g) | ≤2 nm adsorption surface area (%) |
|---|---|---|---|---|---|---|---|---|---|---|---|
| | | Polymer (solids) | CR1 | AG1 | Solvent | n | k | | | | |
| Example 1 | Preparation Example 1 | 9.0 | 0.9 | 0.1 | PnP | 1.80 | 0.22 | 195.2 | 2.256 | 860 | 81.4 |
| Example 2 | Preparation Example 2 | 9.0 | 0.9 | 0.1 | PnP | 1.78 | 0.20 | 190.1 | 2.301 | 831 | 72.3 |
| Example 3 | Preparation Example 3 | 9.0 | 0.9 | 0.1 | PnP | 1.78 | 0.20 | 192.1 | 2.258 | 665 | 73.2 |
| Example 4 | Preparation Example 4 | 9.0 | 0.9 | 0.1 | PGMEA | — | — | 193.1 | 2.155 | 699 | 79.6 |
| Example 5 | Preparation Example 5 | 9.0 | 0.9 | 0.1 | PGMEA | 1.54 (248 nm) | 0.18 (248 nm) | 193.2 | 2.352 | 721 | 74.3 |
| Example 6 | Preparation Example 6 | 9.0 | 0.9 | 0.1 | PnP | 1.81 | 0.21 | 189.5 | 2.274 | 720 | 78.8 |
| Example 7 | Preparation Example 7 | 9.0 | 0.9 | 0.1 | PnP | 1.80 | 0.23 | 191.1 | 3.051 | 925 | 42.1 |
| Comparative Example 1 | Preparation Example 9 | 9.0 | 0.9 | 0.1 | PnP | 1.81 | 0.23 | 190.2 | 2.544 | 786 | 83.6 |
| Comparative Example 2 | Preparation Example 10 | 9.0 | 0.9 | 0.1 | PnP | 1.81 | 0.23 | 190.2 | >20 | 230 | 5.6 |
| Comparative Example 3 | Preparation Example 11 | 9.0 | 0.9 | 0.1 | PGMEA | 1.80 | 0.21 | 190.2 | >20 | 85 | 0.00 |

As shown in Table 1, the films of Examples and Comparative Examples having light-absorbing groups have refractive indexes with an n value in the range of 1.5 to 1.9 and a k value in the range of at least 0.15, indicating the satisfactory anti-reflection effect.

Pore measurements demonstrate that the films of Examples 1 to 7 contain many pores, especially the films of Examples 1 to 6 using tetraalkylammonium hydroxide as the catalyst contain fine pores.

[Preparation of Photoresist Film Material]

A polymer (designated Polymer A) shown below was furnished as a base resin for ArF photoresist film material.

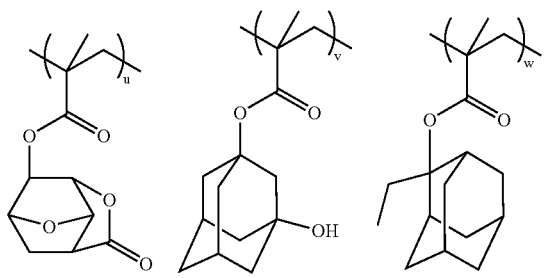

ArF Monolayer Resist Polymer A
(u=0.40, v=0.30, w=0.30 Mw7,800)

A polymer (designated Polymer B) shown below was furnished as a base resin for KrF photoresist film material.

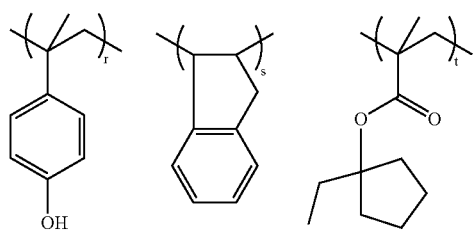

KrF Monolayer Resist Polymer B
(r=0.70, s=0.10, t=0.20 Mw9,300)

Using the polymers (Polymers A and B) furnished as above, photoresist film materials (Resist Nos. 1 and 2) for ArF and KrF lithography were prepared according to the formulation shown in Table 2.

The ingredients in Table 2 are identified below. Acid generator: PAG1 of the structural formula below

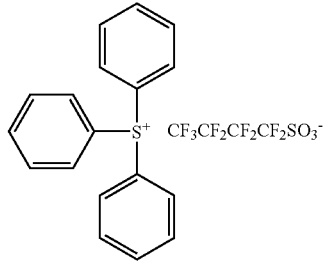

PAG1

Organic Solvent: PGMEA

TABLE 2

| Resist No. | Polymer (pbw) | Acid generator (pbw) | Solvent (pbw) |
|---|---|---|---|
| 1 | Polymer A (100) | PAG1 (4.0) | PGMEA (1200) |
| 2 | Polymer B (100) | PAG1 (2.2) | PGMEA (1200) |

[Pattern Shape Observation, Etching Resistance Test, Stripping Solution Dissolution Test]

Pattern Shape Observation

The antireflective film-forming material prepared above (Examples 1-4, 6, 7, Comparative Examples 1-3 in Table 1) was applied onto a silicon substrate and baked at 200° C. for 120 seconds to form an antireflective film of 193 nm thick. The ArF resist No. 1 solution was applied thereon and baked at 130° C. for 60 seconds to form a photoresist layer of 193 nm thick. The resist film was exposed on an ArF exposure device (S305B by Nikon Corp., NA 0.68, σ 0.85, ⅔ annular illumination, Cr mask), then baked (PEB) at 110° C. for 60 seconds and developed for 60 seconds with a 2.38 wt % TMAH aqueous solution, obtaining a positive pattern. The shape of the resulting 0.12-micron line-and-space pattern was examined. The results are shown in Table 3.

In another run, the antireflective film-forming material prepared above (Example 5 in Table 1) was applied onto a silicon substrate and baked at 200° C. for 120 seconds to form an antireflective film of 200 nm thick. The KrF resist No. 2 solution was applied thereon and baked at 120° C. for 60 seconds to form a photoresist layer of 200 nm thick. The resist film was exposed on a KrF exposure device (S203B by Nikon Corp., NA 0.68, σ 0.75, ⅔ annular illumination, Cr mask), then baked (PEB) at 120° C. for 60 seconds and developed for 60 seconds with a 2.38 wt % TMAH aqueous solution, obtaining a positive pattern. The shape of the resulting 0.15-micron line-and-space pattern was examined. The results are shown in Table 3.

TABLE 3

| Antireflective film material (Table 1) | Photoresist film material (Table 2) | L/S resist pattern shape |
| --- | --- | --- |
| Example 1 | 1 | perpendicular, no footing |
| Example 2 | 1 | perpendicular, no footing |
| Example 3 | 1 | perpendicular, no footing |
| Example 4 | 1 | perpendicular, no footing |
| Example 5 | 2 | perpendicular, no footing |
| Example 6 | 1 | perpendicular, no footing |
| Example 7 | 1 | perpendicular, no footing |
| Comparative Example 1 | 1 | intermixing, footing |
| Comparative Example 2 | 1 | intermixing, footing |
| Comparative Example 3 | 1 | perpendicular, no footing |

It is seen from Table 3 that no intermixing phenomenon occurred in Examples 1 to 7 and Comparative Example 3 using crosslinkable group-containing polymers. No pattern collapse was detected. Good adhesion to the resist was confirmed.

Etching Resistance Test

Antireflective films formed from the antireflective film materials (Examples 1 to 7 and Comparative Examples 1 to 3), photoresist films formed from the photoresist film materials (Resist Nos. 1 and 2), and a porous low-dielectric constant film (dielectric constant 2.3) formed from Preparation Example 11 were examined for etching resistance by the following test. The results are shown in Table 4.

[Etching Test with $CHF_3/CF_4$ Gas]

Using a dry etching instrument TE-8500P by Tokyo Electron Co., Ltd., the antireflective films, resist films and $SO_2$ film were etched. A difference in thickness of the film before and after the etching test was determined.

Etching Conditions

Chamber pressure: 40.0 Pa
RF power: 1300 W
Gap: 9 mm
$CHF_3$ gas flow rate: 30 ml/min
$CF_4$ gas flow rate: 30 ml/min
Ar gas flow rate: 100 ml/min
Time: 10 sec

TABLE 4

| Film material (Tables 1 and 2) | $CHF_3/CF_4$ gas etching rate (nm/min) |
| --- | --- |
| Example 1 | 536 |
| Example 2 | 498 |
| Example 3 | 582 |
| Example 4 | 512 |
| Example 5 | 460 |
| Example 6 | 487 |
| Example 7 | 502 |
| Comparative Example 1 | 654 |
| Comparative Example 2 | 580 |
| Comparative Example 3 | 189 |
| Photoresist 1 | 155 |
| Photoresist 2 | 120 |
| Low-dielectric constant insulating film | 612 |

As seen from Table 4, the antireflective films formed from the antireflective film-forming materials within the scope of the invention (Examples 1 to 7) exhibit a higher rate of dry etching with $CHF_3/CF_4$ gas than the photoresist films. Their dry etching rate is approximate to that of low-dielectric constant insulating film.

Stripping Solution Dissolution Test

Antireflective films and porous low-dielectric constant film formed from the film materials (Examples 1 to 7, Comparative Examples 1 to 3, low-dielectric constant insulating material) were examined by a dissolution test in a stripping solution. The results are shown in Table 5.

The test included two stages.
1st stage: heat treatment prior to immersion
  Condition A: no heat treatment
  Condition B: heated in air at 350° C. for 90 seconds
2nd stage: immersion in stripper
  The film was immersed in EKC-2255 (EKC Technology, basic stripping solution) at 50° C. for 10 minutes.

TABLE 5

| Treatment | A | B |
| --- | --- | --- |
| Stripper | EKC-2255 | |
| Film material | Film thickness reduction (nm) | |
| Example 1 | 5 | 21 |
| Example 2 | 9 | 13 |
| Example 3 | 3 | 15 |
| Example 4 | 2 | 15 |
| Example 5 | 3 | 15 |
| Example 6 | 3 | 19 |
| Example 7 | 3 | 25 |
| Comparative Example 1 | 0 | 0 |
| Comparative Example 2 | 0 | 0 |
| Comparative Example 3 | 0 | 30 |
| Low-dielectric constant film | 0 | 0 |

It is seen from Table 5 that the porous films of the antireflective film-forming materials within the scope of the invention (Examples 1 to 7) are more readily strippable than the inorganic cure type antireflective films of Comparative Examples 1 and 2. Their strippability is further improved-by heat treatment.

Japanese Patent Application No. 2004-172236 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A porous film-forming composition comprising:
(A) a polymer obtained by hydrolytic condensation of silicon compounds selected from the group consisting of hydrolyzable silanes having the general formula (1):

$$R^1{}_n-Si-R^2{}_{4-n} \qquad (1)$$

wherein $R^1$ is each independently a monovalent organic group or hydrogen, $R^2$ is each independently a hydrolyzable group or a hydroxyl group and n is an integer of 0 to 3, a hydrolyzate thereof and a partial condensate thereof, with the proviso that at least one silicon compound having an organic crosslinkable group as $R^1$ is included, at least one silicon compound is a silane of n=0 in formula (1) and at least one silicon compound is a silane of n=1 in formula (1), wherein $R^1$ has at least one non-crosslinkable group selected from the group consisting of methyl, ethyl, propyl, butyl, pentyl, hexyl, cyclohexyl, cyclopentyl, octyl, norbornyl, chloromethyl, chloroethyl, 3,3,3-trifluoropropyl, trifluoromethyl, 2-cyanoethyl, nonafluorohexyl, thexyl, piperidinomethyl, morpholinomethyl, morpholinopropyl, 3-(2'3'-dimethoxypropyl)propyl, 3-(2'-methoxypropoxy)propyl, 3-(tetrahydrofurfurylalkoxy)propyl, 5-methylcarboxylate norbornyl, 5-t-butylcarboxylate norbornyl, 5,6-dimethoxycyclohexylethyl, and 3-(2',3'-dimethoxypropoxy)propyl, the polymer being capable of crosslinking reaction by the organic crosslinkable group, said hydrolytic condensation of a silicon compound being performed in the presence of a hydrolytic catalyst which is a quaternary ammonium hydroxide having the general formula (2):

$$[R^3{}_4N]^+OH^- \qquad (2)$$

wherein $R^3$ is a substituted or unsubstituted monovalent hydrocarbon group of 1 to 4 carbon atoms,
(B) an organic solvent, and
(C) a crosslinking agent selected from the group consisting of melamine compounds, guanamine compounds, glycoluril compounds, urea compounds, which are substituted with at least one group selected from among methylol, alkoxymethyl, and acyloxymethyl groups, tris (2,3-epoxypropyl)isocyanurate, trimethylolmethane triglycidyl ether, trimethylolpropane triglycidyl ether, triethylolethane triglycidyl ether, and alkenyl ether group-containing compounds.

2. A porous film-forming composition comprising:
(A) a polymer obtained by hydrolytic condensation of silicon compounds (S-1), (S-2) and (S-3) selected from the group consisting of a hydrolyzable silane having the general formula (1):

$$R^1{}_n-Si-R^2{}_{4-n} \qquad (1)$$

wherein $R^1$ is each independently a monovalent organic group or hydrogen, $R^2$ is each independently a hydrolyzable group or a hydroxyl group and n is an integer of 0 to 3, a hydrolyzate thereof and a partial condensate thereof,
said silicon compound (S-1) having an organic crosslinkable group as $R^1$, the polymer being capable of crosslinking reaction by the organic crosslinkable group,
said silicon compound (S-2) having a light-absorbing group as to incorporate a light-absorbing structure in the polymer (A), and
said silicon compound (S-3) having a non-crosslinkable group and comprising silanes wherein n=1 and n=0 in formula (1), wherein the non-crosslinkable group is selected from the group consisting of methyl, ethyl, propyl, butyl, pentyl, hexyl, cyclohexyl, cyclopentyl, octyl, norbornyl, chloromethyl, chloroethyl, 3,3,3-trifluoropropyl, trifluoromethyl, 2-cyanoethyl, nonafluorohexyl, thexyl, piperidinomethyl, morpholinomethyl, morpholinopropyl, 3-(2',3'-dimethoxypropyl)propyl, 3-(2'-methoxypropoxy)propyl, 3-(tetrahydrofurfurylalkoxy)propyl, 5-methylcarboxylate norbornyl, 5-t-butylcarboxylate norbornyl, 5,6-dimethoxycyclohexylethyl, and 3-(2',3'-dimethoxypropoxy)propyl,
(B) an organic solvent, and
(C) a crosslinking agent selected from the group consisting of melamine compounds, guanamine compounds, glycoluril compounds, urea compounds, which are substituted with at least one group selected from among methylol, alkoxymethyl, and acyloxymethyl groups, tris (2,3-epoxypropyl)isocyanurate, trimethylolmethane triglycidyl ether, trimethylolpropane triglycidyl ether, triethylolethane triglycidyl ether, and alkenyl ether group-containing compounds.

* * * * *